(12) United States Patent
Park et al.

(10) Patent No.: US 11,664,069 B2
(45) Date of Patent: May 30, 2023

(54) IN-MEMORY COMPUTING DEVICE SUPPORTING ARITHMETIC OPERATIONS

(71) Applicant: Korea University Research and Business Foundation, Seoul (KR)

(72) Inventors: Jongsun Park, Seoul (KR); Kyeongho Lee, Seoul (KR); Woong Choi, Bucheon-si (KR)

(73) Assignee: Korea University Research and Business Foundation, Seoul (KR)

( * ) Notice: Subject to any disclaimer, the term of this patent is extended or adjusted under 35 U.S.C. 154(b) by 82 days.

(21) Appl. No.: 17/377,766

(22) Filed: Jul. 16, 2021

(65) Prior Publication Data

US 2022/0028445 A1    Jan. 27, 2022

(30) Foreign Application Priority Data

Jul. 21, 2020 (KR) .................. 10-2020-0090069
Oct. 22, 2020 (KR) .................. 10-2020-0137802

(51) Int. Cl.

| | |
|---|---|
| *G11C 11/4091* | (2006.01) |
| *G11C 11/4096* | (2006.01) |
| *G11C 11/4094* | (2006.01) |
| *H03K 19/21* | (2006.01) |
| *G06F 7/523* | (2006.01) |
| *H03K 19/173* | (2006.01) |
| *G06F 7/544* | (2006.01) |

(52) U.S. Cl.
CPC .......... *G11C 11/4091* (2013.01); *G06F 7/523* (2013.01); *G06F 7/5443* (2013.01); *G11C 11/4094* (2013.01); *G11C 11/4096* (2013.01); *H03K 19/1737* (2013.01); *H03K 19/215* (2013.01)

(58) Field of Classification Search
CPC ............ G11C 11/4091; G11C 11/4094; G11C 11/4096; G11C 7/1006; G11C 11/419; G06F 7/523; G06F 7/5443; G06F 7/501; H03K 19/1737; H03K 19/215
See application file for complete search history.

(56) References Cited

U.S. PATENT DOCUMENTS

| | | | |
|---|---|---|---|
| 2021/0089272 A1* | 3/2021 | Jain ..................... | G06N 3/0454 |
| 2022/0012011 A1* | 1/2022 | Wang ..................... | G06F 7/523 |
| 2022/0044723 A1* | 2/2022 | Yudanov ............. | G06F 12/0873 |
| 2022/0108203 A1* | 4/2022 | Mehendale ........... | G11C 11/419 |

* cited by examiner

*Primary Examiner* — Ajay Ojha
(74) *Attorney, Agent, or Firm* — NSIP Law

(57) ABSTRACT

An in-memory computing device includes a memory cell array and a column peripheral circuit including a plurality of column peripheral units connected to a plurality of pairs of bit lines connected to the memory cell array. Each of the column peripheral units includes a sense amplifying and writing unit sensing and amplifying bitwise data through one pair of bit lines among the pairs of bit lines and an arithmetic logic unit performing an arithmetic operation with a full adder Boolean equation based on the bitwise data and performing a write back operation on operation data obtained by the arithmetic operation via the sense amplifying and writing unit.

20 Claims, 19 Drawing Sheets

IN-MEMORY COMPUTING DEVICE SUPPORTING ARITHMETIC OPERATIONS

CROSS-REFERENCE TO RELATED APPLICATION

This U.S. non-provisional patent application claims priorities under 35 U.S.C. § 119 of Korean Patent Applications Nos. 10-2020-0090069, filed on Jul. 21, 2020, and 10-2020-0137802, filed on Oct. 22, 2020, the contents of which are hereby incorporated by reference in their entirety.

BACKGROUND

1. Field of Disclosure

The present disclosure relates to an in-memory computing device that supports arithmetic operations. More particularly, the present disclosure relates to an in-memory computing device that supports integer operations requiring a carry propagation at high speed.

2. Description of the Related Art

A conventional cache memory is limited to read and write operations that are relatively slow compared with arithmetic operations. However, as data required by a CPU increase, the number of accesses to the memory increases, and as a result, the burden on the memory is increasing. In recent years, computing in-memory structures that perform arithmetic operations in the memory in addition to read and write operations are being proposed in order to reduce a bottleneck in the memory, which is an inherent problem of the memory.

SUMMARY

The present disclosure provides an in-memory computing device that supports integer operations requiring a carry propagation at high speed.

Embodiments of the inventive concept provide an in-memory computing device including a memory cell array and a column peripheral circuit including a plurality of column peripheral units connected to a plurality of pairs of bit lines connected to the memory cell array. Each of the column peripheral units includes a sense amplifying and writing unit sensing and amplifying bitwise data through one pair of bit lines among the pairs of bit lines and an arithmetic logic unit performing an arithmetic operation with a full adder Boolean equation based on the bitwise data and performing a write back operation on operation data obtained by the arithmetic operation via the sense amplifying and writing unit.

Embodiments of the inventive concept provide an in-memory computing device including a memory cell array, a column peripheral circuit including a plurality of column peripheral units connected to the memory cell array, a dummy cell array storing multiplicand data stored in the memory cell array, a BL separator separating the dummy cell array from the memory cell array, and a shift register circuit controlling a multiplication operation of the column peripheral units based on multiplier data loaded from the memory cell array.

According to the above, the in-memory computing device enables the arithmetic operation to be performed at high speed in the memory.

In addition, when performing an integer operation, a carry propagation delay is reduced and a multiplication latency is decreased, and thus, an energy efficiency of operations is improved.

In addition, a capacitance in the memory is reduced to increase the operation speed, and thus, an energy consumption is reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
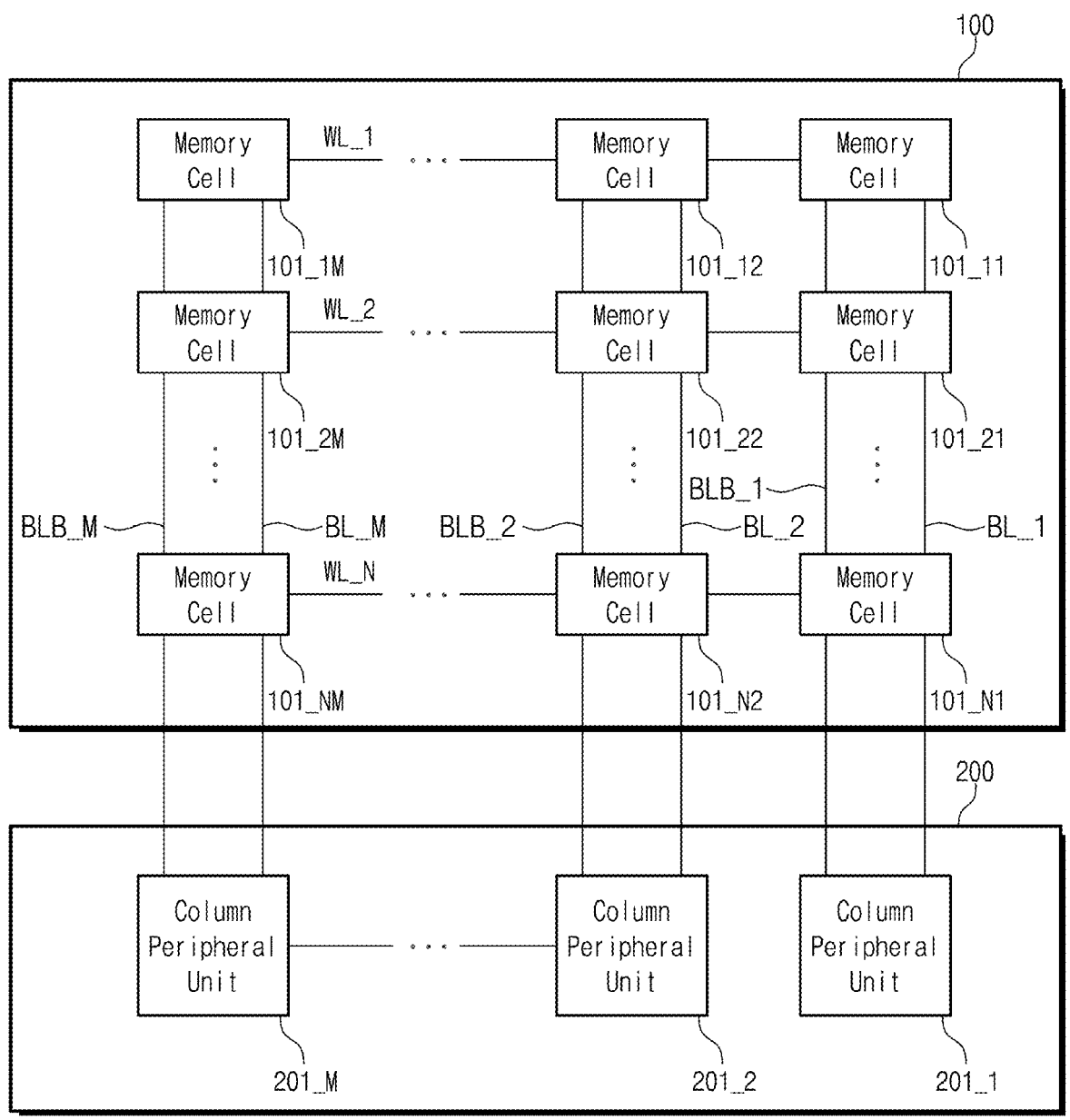
FIG. 1 is a block diagram showing an in-memory computing device according to an embodiment of the present disclosure.

Hereinafter, embodiments of the present disclosure will be described with reference to specific embodiments and the accompanying drawings. However, the embodiments of the present disclosure may be modified in various other forms, and the scope of the present disclosure is not limited to the embodiments described below. In addition, embodiments of the present disclosure are provided to more fully describe the present disclosure to those skilled in the art. Accordingly, the shape and size of elements in the drawings may be exaggerated for a clearer description, and elements indicated by the same reference numerals in the drawings are the same elements.

In addition, in order to clearly describe the present disclosure in the drawings, parts Irrelevant to the description are omitted, and thicknesses are enlarged to clearly express various layers and regions, and components having the same function within the scope of the same idea have the same reference. Further, throughout the specification, when a part "includes" a certain component, it means that the component may further include other components, not to exclude other components, unless otherwise stated.

Figure 2:
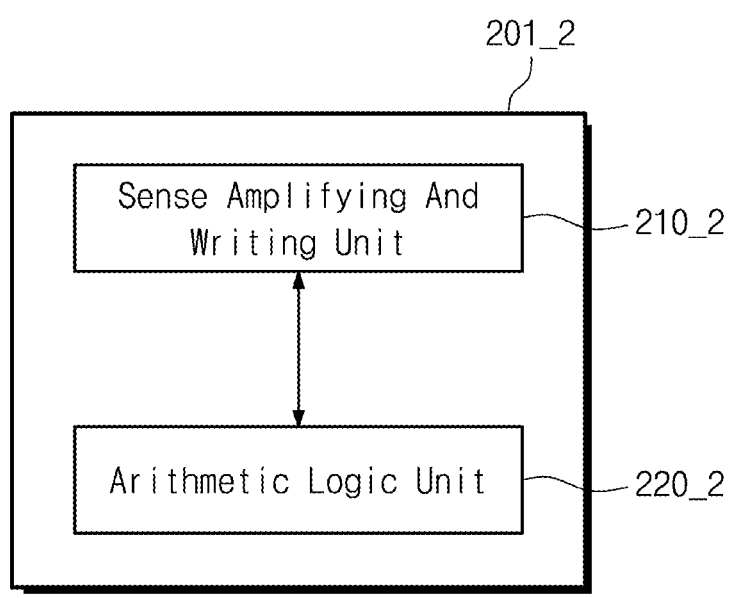
FIG. 2 is a block diagram showing a column peripheral unit of FIG. 1.

FIG. 1 is a block diagram showing an in-memory computing device 10 according to an embodiment of the present disclosure, and FIG. 2 is a block diagram showing a column peripheral unit 201_2 of FIG. 1.

The in-memory computing device 10 may be embodied by various types of storage devices. Examples of such storage devices may include, but are not limited to, volatile memory devices such as a dynamic random access memory (DRAM) and a static RAM (SRAM).

Referring to FIGS. 1 and 2, the in-memory computing device 10 may include a memory cell array 100 and a column peripheral circuit 200.

The memory cell array 100 may include a plurality of memory cells 101_11 to 101_NM connected to a plurality of word lines WL_1 to WL_N and a plurality of pairs of bit lines BLB_1 to BLB_M and BL_1 to BL_M.

The column peripheral circuit 200 may include a plurality of column peripheral units 201_1 to 201_M connected to the memory cell array 100 via each pair of bit lines In the present embodiment, each of the column peripheral units 201_1 to 201_M may include a sense amplifying and writing unit, for example, 210_2, and an arithmetic logic unit, for example, 220_2.

In detail, the sense amplifying and writing unit 210_2 may sense and amplify bitwise data via the pair of bit lines BLB and BL connected to the memory cell array 100. In this case, the bitwise data may be data output from the memory cell array 100 via the pair of bit lines BLB and BL as one or more word line signals are activated. As an example, the bitwise data may include an AND operation value and a NOR operation value.

The arithmetic logic unit 220_2 may perform an arithmetic operation with a full adder Boolean equation based on the bitwise data. The full adder Boolean equation may be an equation to perform an arithmetic operation on a carry value and a sum value.

In this case, the arithmetic logic unit 220_2 may perform a write-back operation on operation data, which are obtained through the arithmetic operation, through the sense amplifying and writing unit 210_2. The operation data may be one of logic data including NAND, AND, NOR, OR, XNOR, XOR, NOT, and Shift operation values and integer data including ADD, ADD-Shift, SUB, and MULT operation values.

According to an embodiment, as the in-memory computing device 10 may perform the arithmetic operation with the full adder Boolean equation through the arithmetic logic unit 220_2 and may perform the write-back operation on the operation data, which are obtained through the arithmetic operation, through the sense amplifying and writing unit 210_2, the arithmetic operation may be performed at high speed in a memory.

Hereinafter, the arithmetic logic unit 220_2 will be described in detail with reference to FIGS. 3 and 4.

Figure 3:
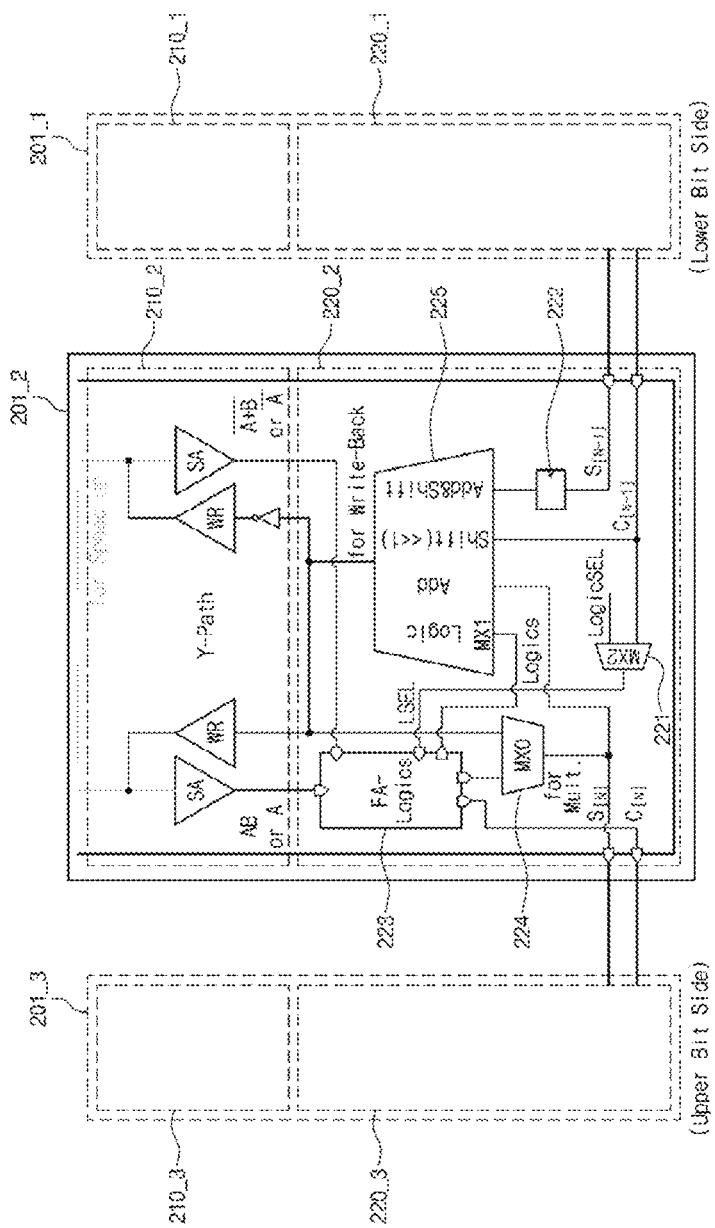
FIG. 3 is a circuit diagram showing an arithmetic logic unit of FIG. 2.
Figure 4:
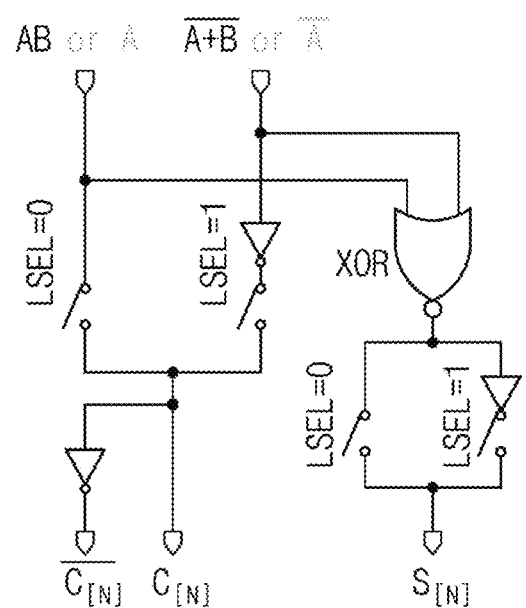
FIG. 4 is a circuit diagram showing a full adder logic of FIG. 3.

FIG. 3 is a circuit diagram showing the arithmetic logic unit 220_2 of FIG. 2, and FIG. 4 is a circuit diagram showing a full adder logic 223 of FIG. 3.

Referring to FIG. 3, the arithmetic logic unit 220_2 may include a first multiplexer 221, a shift flip-flop 222, the full adder logic 223, a second multiplexer 224, and a third multiplexer 225.

The first multiplexer 221 may receive a first carry value $C_{N-1}$ from a lower bit side. In detail, the first multiplexer 221 may receive the first carry value $C_{N-1}$ from the arithmetic logic unit 220_1 of the column peripheral unit 201_1 connected to a pair of lower bit lines.

In addition, the first multiplexer 221 may apply a selection signal LSEL to the full adder logic 223 in response to a selection control signal LogicSEL to control the full adder logic 223.

The shift flip-flop 222 may receive a first sum value $S_{N-1}$ from the lower bit side. In detail, the shift flip-flop 222 may receive and store the first sum value $S_{N-1}$ from the arithmetic logic unit 220_1 of the column peripheral unit 201_1 connected to the pair of lower bit lines.

The full adder logic 223 may calculate a second carry value $C_N$ and a second sum value $S_N$ with the full adder Boolean equation based on the bitwise data, the first carry value $C_{N-1}$, and the first sum value $S_{N-1}$, which are sensed by the sense amplifying and writing unit 210_2.

According to an embodiment, the full adder logic 223 may be implemented by a transmission gate-based circuit that is switched in response to the selection signal LSEL provided from the first multiplexer 221 as shown in FIG. 4, and thus, a carry propagation delay may be more reduced than in a logic gate-based full adder.

In this case, the full adder logic 223 may output the second sum value $S_N$ to the second multiplexer 224 and may output the second carry value $C_N$ to an third arithmetic logic unit 220_3 of a column peripheral unit 201_3 connected to a pair of upper bit lines.

The second multiplexer 224 may receive the second sum value $S_N$ calculated by the full adder logic 223 and may transmit the second sum value $S_N$ to an upper bit side.

In detail, the second multiplexer 224 may transmit the second sum value $S_N$ calculated by the full adder logic 223 to the third arithmetic logic unit 220_3 of the column peripheral unit 201_3 connected to the pair of upper bit lines.

In addition, the second multiplexer 224 may output the second sum value $S_N$ calculated by the full adder logic 223 to the third multiplexer 225.

The third multiplexer 225 may receive at least one of the first carry value $C_{N-1}$, the first sum value $S_{N-1}$, the second sum value $S_N$, and the logic data Logics. In this case, the third multiplexer 225 may write back at least one of the first carry value $C_{N-1}$, the first sum value $S_{N-1}$, the second sum value $S_N$, and the logic data Logics to the memory cell array 100 through the sense amplifying and writing unit 210.

Hereinafter, a shift operation of the column peripheral circuit 200 will be described in detail with reference to FIG. 5.

Figure 5:
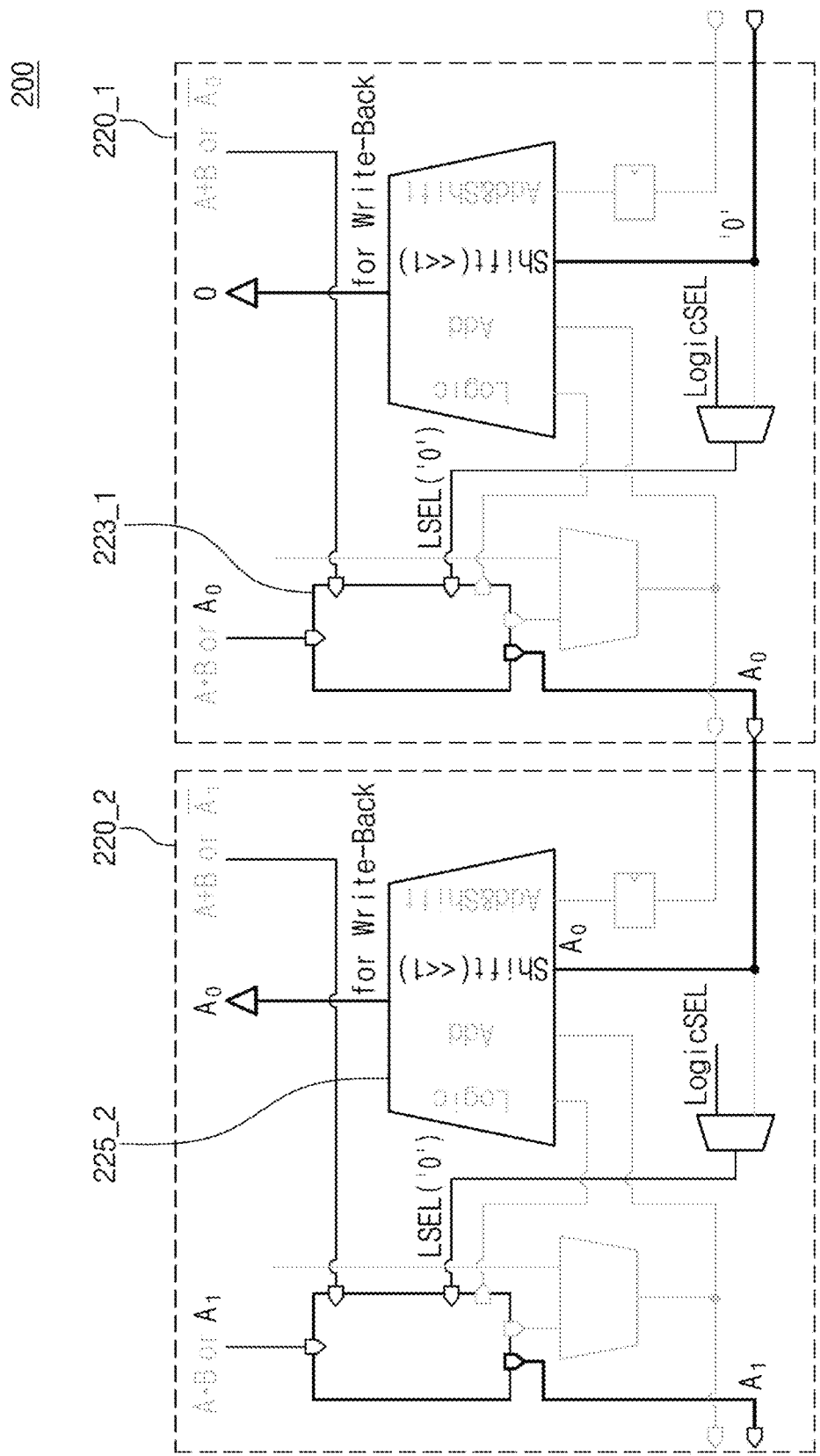
FIG. 5 is a circuit diagram explaining a shift operation of the column peripheral circuit of FIG. 1.

FIG. 5 is a circuit diagram explaining the shift operation of the column peripheral circuit 200 of FIG. 1.

Referring to FIG. 5, the column peripheral circuit 200 may perform the shift operation that transmits bitwise data A0 to a direction of the upper bit side.

In detail, the column peripheral circuit 200 may transmit the bitwise data A0 output through a first arithmetic logic unit 220_1 to a second arithmetic logic unit 220_2 located in the direction of the upper bit side.

In this case, the first arithmetic logic unit 220_1 may be located at the lower bit side of the second arithmetic logic unit 220_2, the second arithmetic logic unit 220_2 may be located at the upper bit side of the first arithmetic logic unit 220_1, and the first and second arithmetic logic units 220_1 and 220_2 may be electrically connected to each other.

That is, the column peripheral circuit 200 may transmit the bitwise data A0 output through a full adder logic 223_1 of the first arithmetic logic unit 220_1 to a third multiplexer 225_2 of the second arithmetic logic unit 220_2. In this case, the third multiplexer 225_2 may write back the bitwise data A0 through the sense amplifying and writing unit 210_2.

In addition, the column peripheral circuit 200 may perform all shift operations performed by a plurality of arithmetic logic units 220_1 to 220_3 at the same time in a single period in which the shift operation is performed.

Hereinafter, an add operation of the column peripheral circuit 200 will be described in detail with reference to FIGS. 6A and 6B.

Figure 6A:
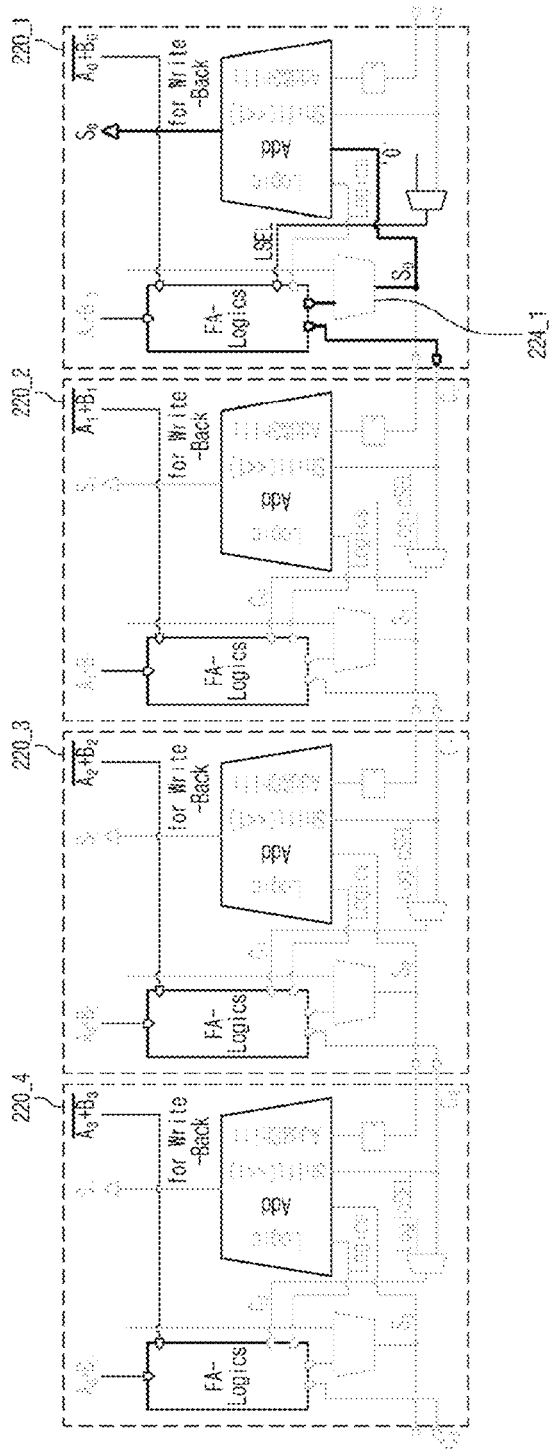
FIGS. 6A and 6B are circuit diagrams explaining an add operation of the column peripheral circuit of FIG. 1.
Figure 6B:
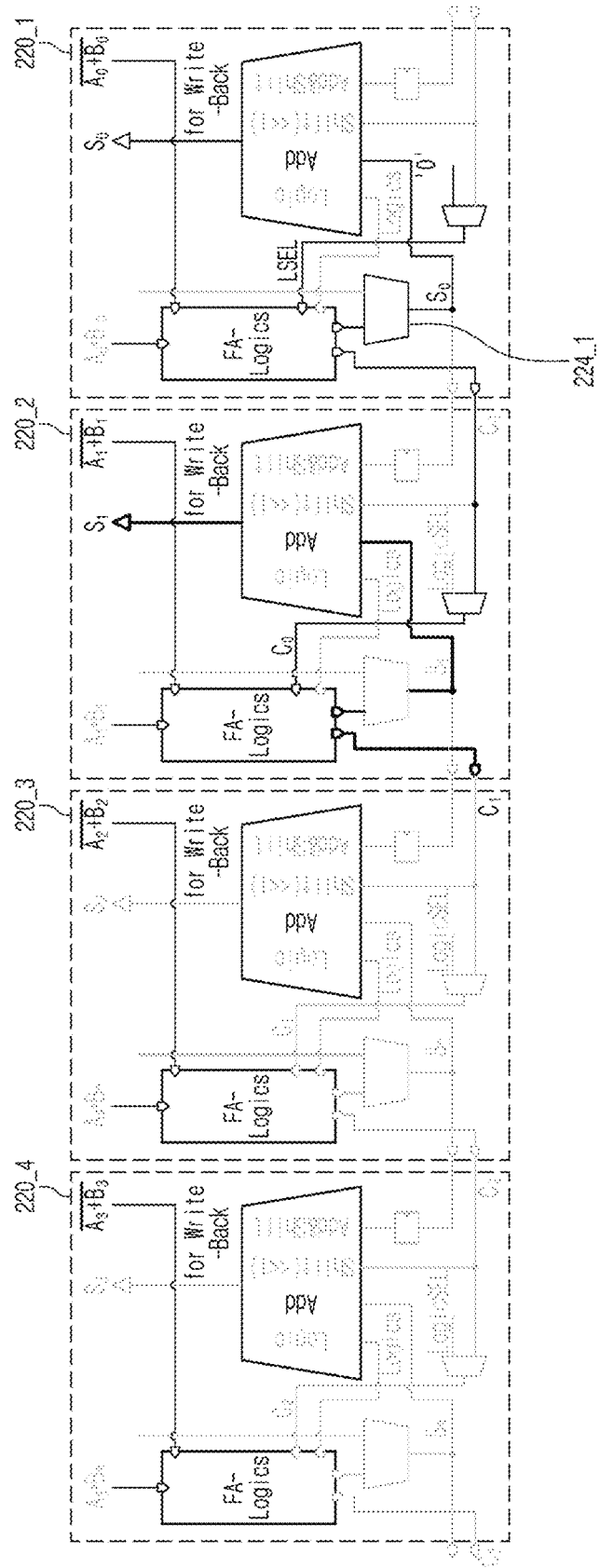

FIGS. 6A and 6B are circuit diagrams explaining the add operation of the column peripheral circuit 200 of FIG. 1.

Referring to FIGS. 6A and 6B, the column peripheral circuit 200 may transmit the second carry value CN calculated by the full adder Boolean equation to the direction of the upper bit side and may perform the add operation to write back the second sum value $S_N$ calculated by the full adder Boolean equation.

As an example, the column peripheral circuit 200 may transmit a carry value C0 calculated by the first arithmetic logic unit 220_1 to the second arithmetic logic unit 220_2 as shown in FIG. 6A. In this case, the column peripheral circuit 200 may write back a second sum value S0 calculated by the first arithmetic logic unit 220_1 through a third multiplexer 225_1.

In addition, as shown in FIG. 6A, the column peripheral circuit 200 may transmit a carry value C1 calculated by the second arithmetic logic unit 220_2 to a third arithmetic logic unit 220_3. In this case, the column peripheral circuit 200 may write back a second sum value S1 calculated by the second arithmetic logic unit 220_2 through the third multiplexer 225_2.

That is, each carry value C0 output through a corresponding arithmetic logic unit of the arithmetic logic units 220_1 to 220_4 may be transmitted to the direction of the upper bit line, and the column peripheral circuit 200 may write back each of the sum values S0 to S3 output through a corresponding arithmetic logic unit of the arithmetic logic units 220_1 to 220_4.

In addition, the column peripheral circuit 200 may perform all the add operations performed by the arithmetic logic units 220_1 to 220_3 at the same time in a single period in which the add operation is performed.

In detail, the column peripheral circuit 200 may transmit each of the carry values C0 to C3 based on the full adder Boolean equation to the upper bit side and may perform all the add operations to write back each of the sum values S0 to S3 based on the full adder Boolean equation at the same time in the single period in which the add operation is performed.

Hereinafter, the add-shift operation of the column peripheral circuit 200 will be described in detail with reference to FIGS. 7A and 7B.

Figure 7A:
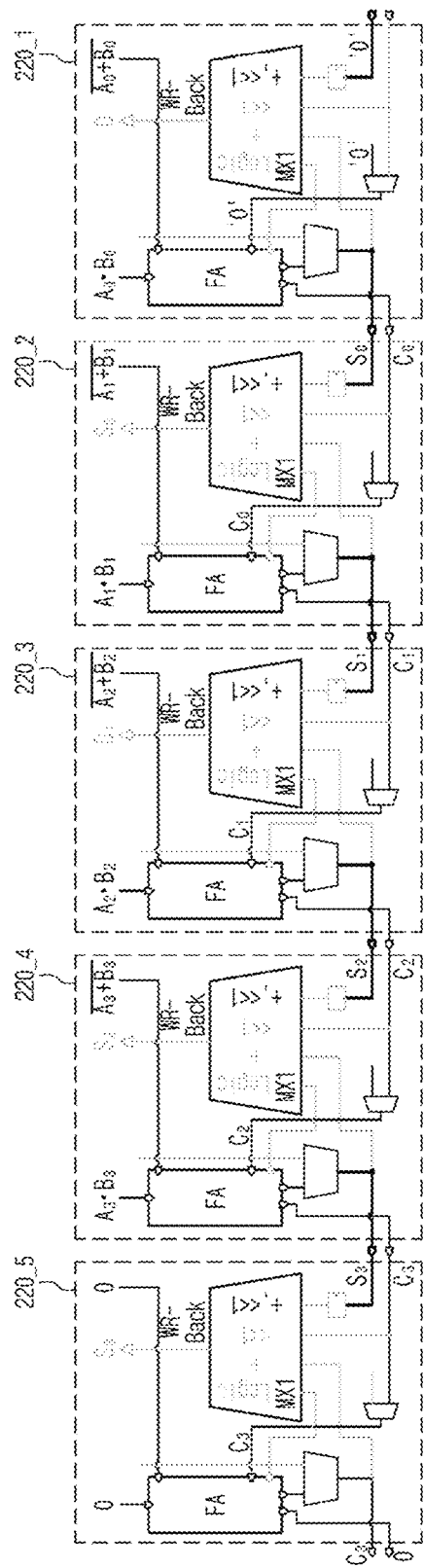
FIGS. 7A and 7B are circuit diagrams explaining an add-shift operation of the column peripheral circuit of FIG. 1.
Figure 7B:
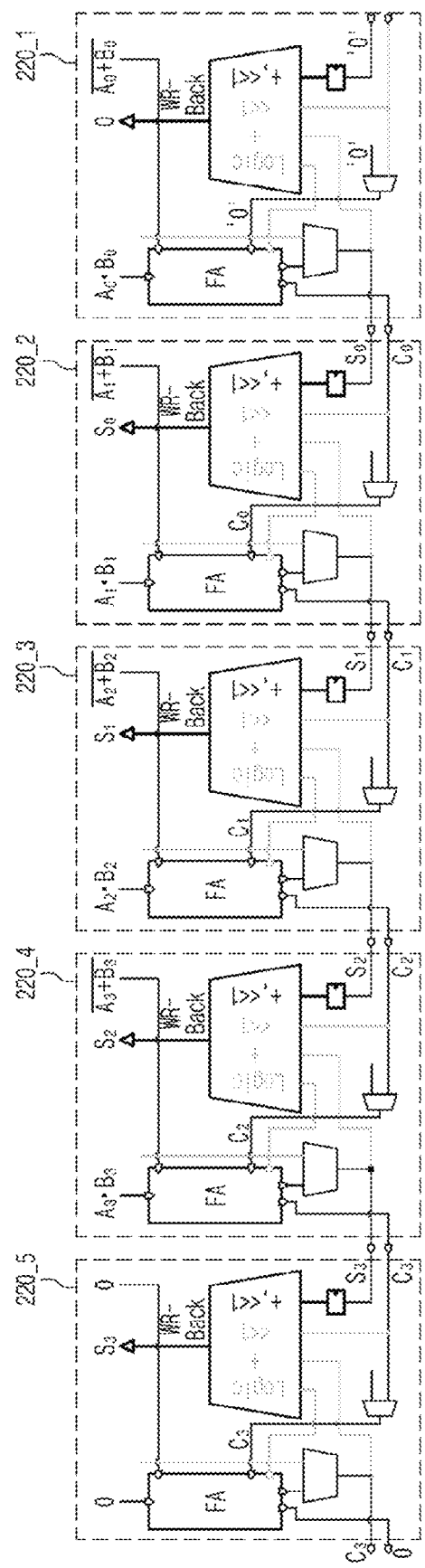

FIGS. 7A and 7B are circuit diagrams explaining the add-shift operation of the column peripheral circuit 200 of FIG. 1.

Referring FIGS. 7A and 7B, the column peripheral circuit 200 may transmit the second sum value $S_N$ calculated by the full adder Boolean equation to the upper bit side, and thus, the column peripheral circuit 200 may perform the add-Shift operation to write back the first sum value $S_{N-1}$ provided from the lower bit side.

As an example, the first to fourth arithmetic logic units 220_1 to 220_4 may transmit the second sum values S0 to S3 to the upper bit side, respectively, as shown in FIG. 7A.

Then, as shown in FIG. 7B, the first to fifth arithmetic logic units 220_1 to 220_5 may write back the first sum values 0 and S0 to S3 respectively provided from shift flip-flops 222_1 to 222_5 using the third multiplexers 225_1 to 225_5, respectively.

That is, the column peripheral circuit 200 may write back the first sum values 0 and S0 to S3 applied from the lower bit side via the first to fifth arithmetic logic units 220_1 to 220_5 based on the second sum values S0 to S3 transmitted to the upper bit side from the first to fourth arithmetic logic units 220_1 to 220_4, and thus, the column peripheral circuit 200 may perform the add-shift operation.

According to an embodiment, a period in which the add-shift operation is performed comprises a first period in which the second sum value is transmitted to the upper bit side and a second period in which the first sum value is written back.

According to an embodiment, the column peripheral circuit 200 may perform all the add-shift operations performed by the arithmetic logic units 220_1 to 220_5 at the same time in a single period in which the add-shift operation is performed.

In detail, the column peripheral circuit 200 may transmit the second sum value to the upper bit side in the single period in which the add-shift operation is performed, and thus, the column peripheral circuit 200 may perform all the add-shift operations that write back the first sum values provided from the lower bit side at the same time.

Figure 8:
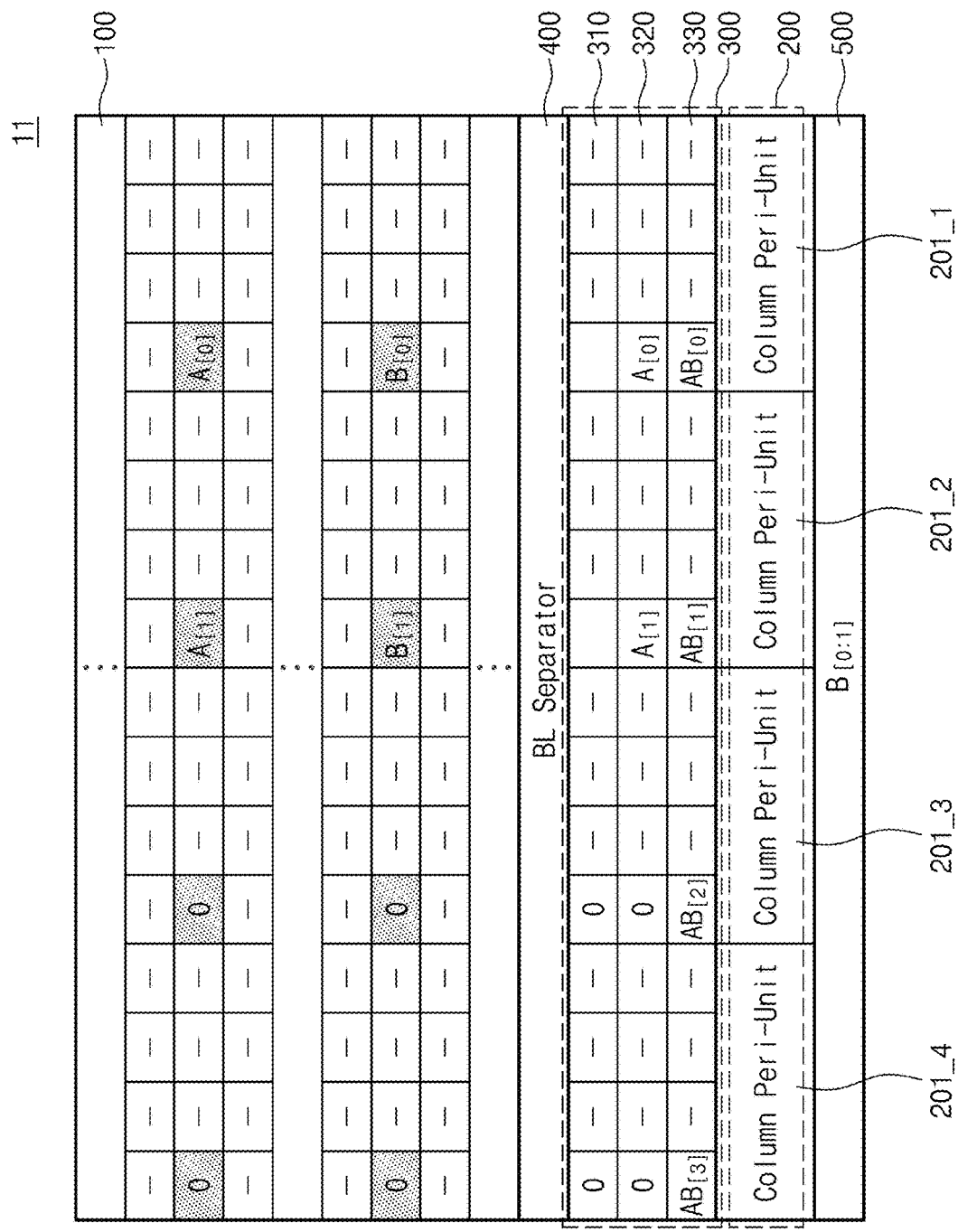
FIG. 8 is a conceptual diagram showing an in-memory computing device according to another embodiment of the present disclosure.
Figure 9:
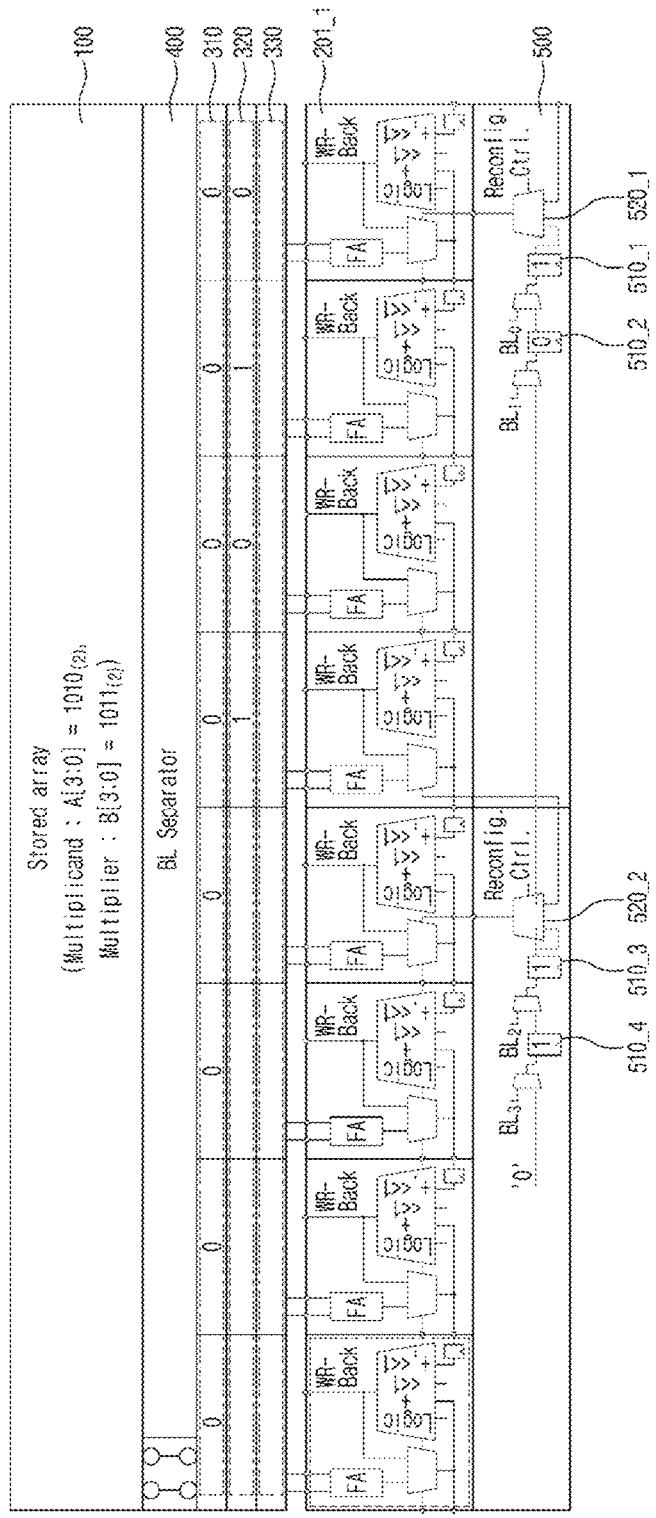
FIG. 9 is a circuit diagram showing the in-memory computing device of FIG. 8.
Figure 10:
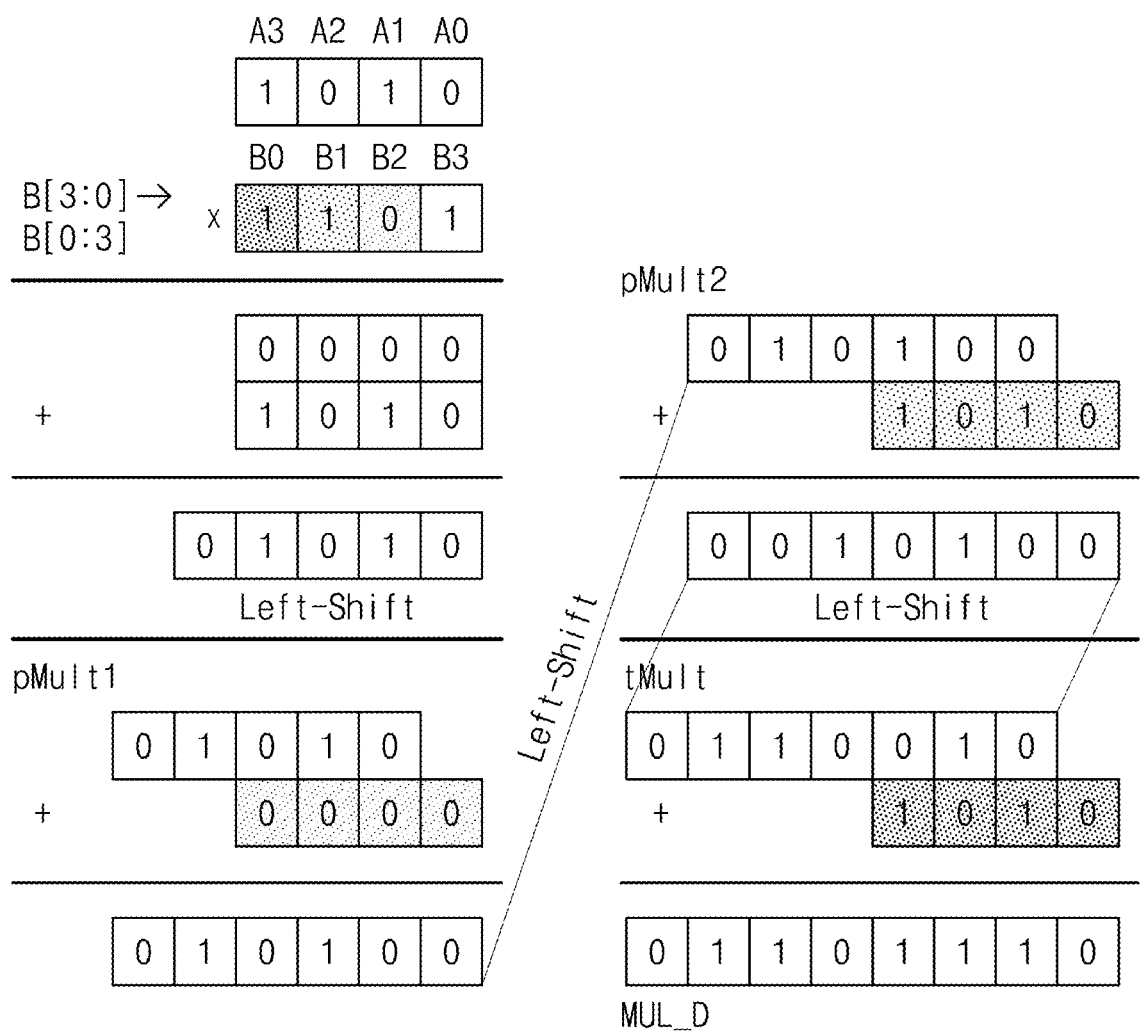
FIG. 10 is a view explaining a left-shift multiplication operation.

FIG. 8 is a conceptual diagram showing an in-memory computing device 11 according to another embodiment of the present disclosure, FIG. 9 is a circuit diagram showing the in-memory computing device 11 of FIG. 8, and FIG. 10 is a view explaining a left-shift multiplication operation.

Referring to FIGS. 8 and 9, the in-memory computing device 11 may include a memory cell array 100, a column peripheral circuit 200, a dummy cell array 300, a BL separator 400, and a shift register circuit 500. Hereinafter, in FIGS. 8 to 10, detailed descriptions of the memory cell array 100 and the column peripheral circuit 200, which are assigned with the same reference numerals as those described with reference to FIGS. 1 to 7, will be omitted.

The memory cell array 100 may previously store multiplier data and multiplicand data A3, A2, A1, and A0, which are activated in response to at least two word line signals. The multiplier data and the multiplicand data may be data used in a multiplication operation.

The column peripheral circuit 200 may include a plurality of column peripheral units 201_1 to 201_8 connected to the memory cell array 100 via a plurality of bit lines.

As shown in FIG. 3, each of the column peripheral units 201_1 to 201_3 may include a sense amplifying and writing unit and an arithmetic logic unit, and in this case, the arithmetic logic unit 220 may include a first multiplexer 221, a shift flip-flop 222, a full adder logic 223, a second multiplexer 224, and a third multiplexer 225.

The dummy cell array 300 may be disposed between the memory cell array 100 and the column peripheral circuit 200 and may store the multiplicand data A3, A2, A1, and A0 stored in the memory cell array 100.

The dummy cell array 300 may include first, second, and third sub-arrays 310, 320, and 330 disposed to be spaced apart from each other in a column direction.

In detail, the first sub-array 310 may include a plurality of dummy cells arranged in a row direction to store data of zero (0). In addition, the second sub-array 320 may include a plurality of dummy cells arranged in the row direction to store the multiplicand data A3, A2, A1, and A0 stored in the memory cell array 100 in the order of least significant bit to most significant bit. In addition, the third sub-array 330 may include a plurality of dummy cells arranged in the row direction and storing temporary data that are written back by the column peripheral circuit 200.

The BL separator 400 may be disposed between the memory cell array 100 and the dummy cell array 300 to separate the memory cell array 100 from the dummy cell array 300.

In detail, the BL separator 400 may electrically insulate the dummy cell array 300 from the memory cell array 100 based on whether the column peripheral circuit 200 performs a multiplication operation or not. As an example, as the BL separator 400 switches off switches connecting the memory cell array 100 and the dummy cell array 300, a capacitance in the in-memory computing device 11 may be reduced. As a result, an operation speed of the in-memory computing device 11 may quickly increase, and an energy consumption of the in-memory computing device 11 may be reduced.

The shift register circuit 500 may control the multiplication operation of the column peripheral units based on the multiplier data B3, B2, B1, B0 that are loaded from the memory cell array 100 via an arbitrary bit line.

The shift register circuit 500 may include a plurality of multiplier flip-flops 510_1 to 510_4 and a plurality of control multiplexers 520_1 to 520_2.

In detail, the multiplier flip-flops 510_1 to 510_N may store load data B0, B1, B2, and B3 for each bit to output the multiplier data B3, B2, B1, and B0 in the order of the most significant bit to the least significant bit based on the multiplier data B3, B2, B1, and B0.

In the present embodiment, the load data may be data obtained by loading the multiplier data B3, B2, B1, and B0 to the shift register circuit 500 in the order of the most significant bit to the least significant bit. For example, in a case where the multiplier data B3, B2, B1, and B0 are '1011', the load data B0, B1, B2, and B3 may be '1101'.

In this case, the control multiplexers 520_1 to 520_N may transmit a control signal to control the column peripheral units 201_1 to 201_8 based on the load data B0, B1, B2, and B3.

For example, in a case where the multiplicand data A3, A2, A1, and A0 are '1010' and the multiplier data B3, B2, B1, and B0 are '1011' as shown in FIG. 9, the multiplier flip-flops 510_1 to 510_N may store '1101' as the load data B0, B1, B2, and B3.

Then, the multiplier flip-flops 510_1 to 510_N may transmit the load data B0, B1, B2, and B3 to the control multiplexers 520_1 to 520_N in the order of the least significant bit to the most significant bit.

In this case, the control multiplexers 520_1 to 520_N may transmit a control signal to each of second multiplexers to control the column peripheral circuit 200 based the load data B0, B1, B2, and B3.

That is, as the shift register circuit 500 transmits the control signal corresponding to the load data B0, B1, B2, and B3, which are to be output in the order of the most significant bit to the least significant bit, to the column peripheral circuit 200, the multiplication operation of the column peripheral circuit 200 may be controlled.

According to an embodiment, the column peripheral circuit 200 may perform the multiplication operation on the multiplicand data A3, A2, A1, and A0 and the load data B0, B1, B2, and B3.

In detail, the column peripheral circuit 200 may repeatedly perform a left-shift multiplication operation on the multiplicand data A3, A2, A1, and A0 stored in the dummy array 300 and the load data B0, B1, B2, and B3 sequentially loaded by the shift register circuit 500.

For example, as shown in FIG. 10, the column peripheral circuit 200 may add '1010' obtained by multiplying the multiplicand data A3, A2, A1, and A0 by B3 and '0000' that are data of zero (0) and may shift the added result in a left direction to obtain '10100' that are first temporary data pMult0. Then, the column peripheral circuit 200 may add '0000' obtained by multiplying the multiplicand data A3, A2, A1, and A0 by B2 and the first temporary data and may shift the added result in the left direction to obtain '010100' that are second temporary data. After that, the column peripheral circuit 200 may add '1010' obtained by multiplying the multiplicand data A3, A2, A1, and A0 by B1 and the second temporary data and may shift the added result in the left direction to obtain '0110010' that are third temporary data. Then, the column peripheral circuit 200 may add '1010' obtained by multiplying the multiplicand data A3, A2, A1, and A0 by B0 and the third temporary data and may obtain '01101110' that are multiplication data MUL_D obtained by multiplying the multiplicand data A3, A2, A1, and A0 and the multiplier data B3, B2, B1, and B0.

Hereinafter, the left-shift multiplication operation of the column peripheral circuit 200 will be described in detail with reference to FIGS. 11 to 18.

Figure 11:
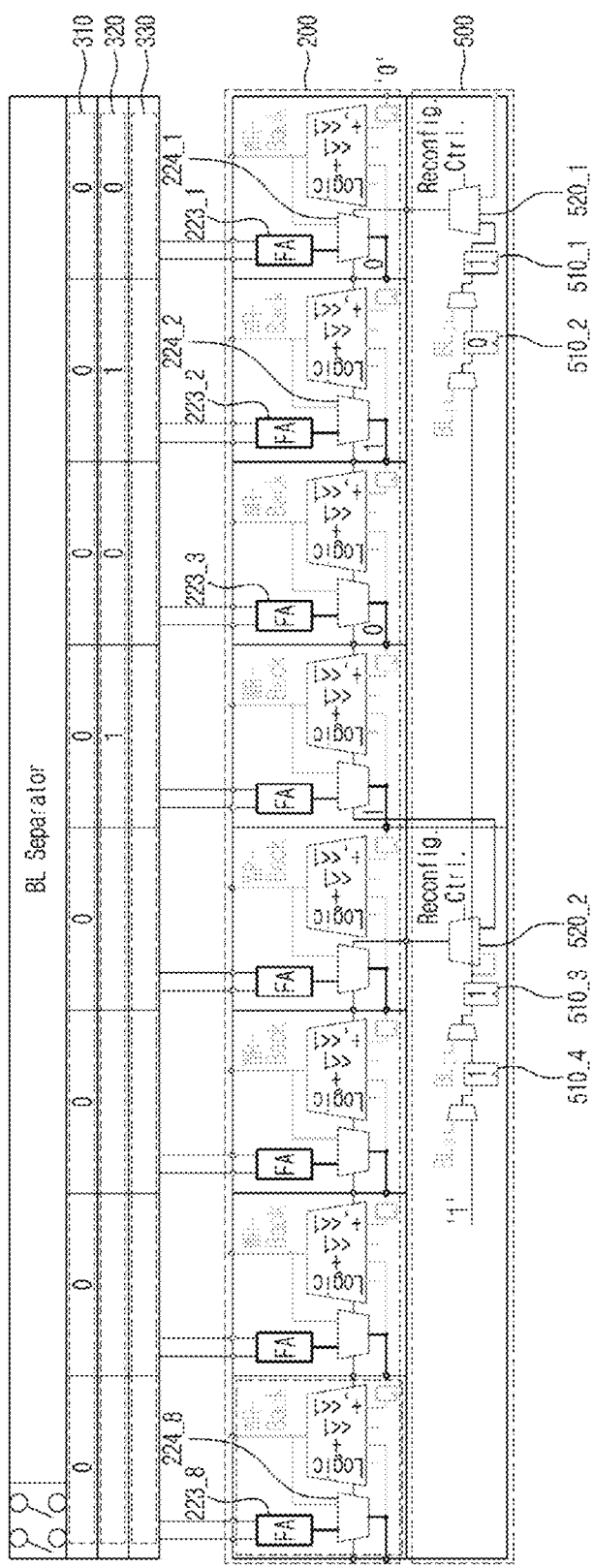
FIGS. 11 and 12 are circuit diagrams showing an operation of an in-memory computing device to obtain first temporary data of FIG. 10.
Figure 12:
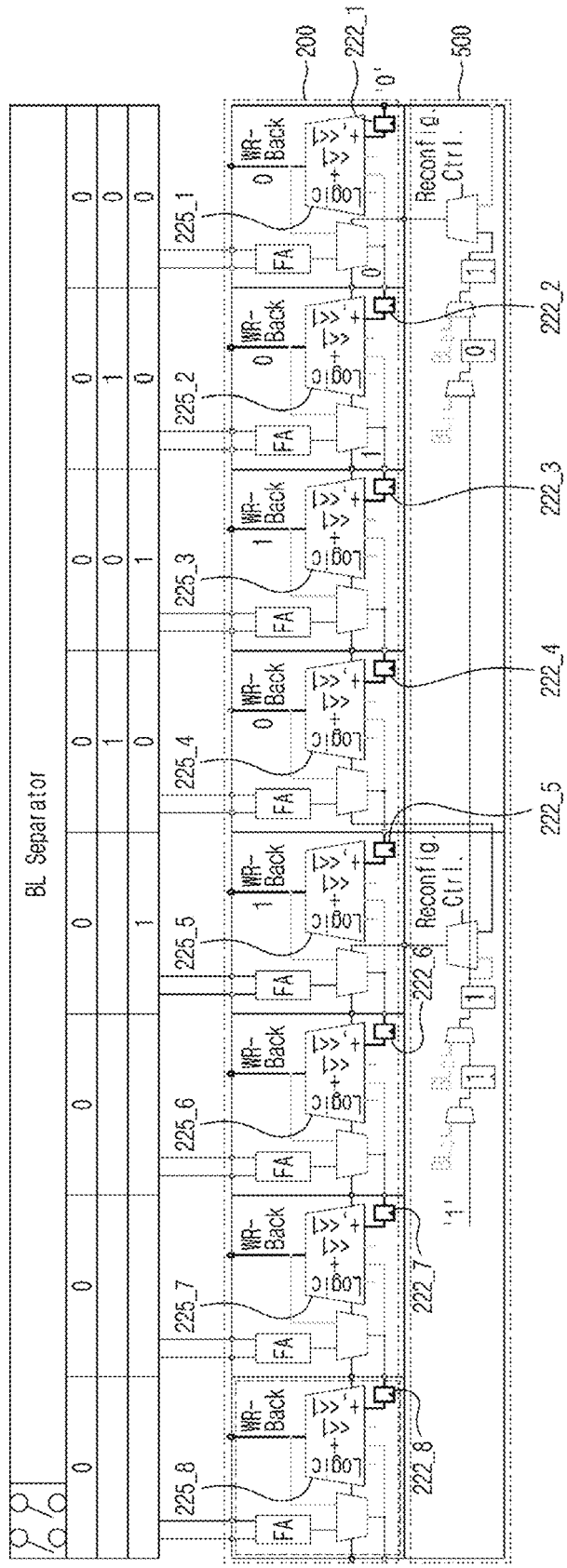

FIGS. 11 and 12 are circuit diagrams showing an operation of the in-memory computing device 11 to obtain the first temporary data pMult1 of FIG. 10.

Referring to FIGS. 11 and 12, the column peripheral circuit 200 may perform the add-shift operation for each column on the first and second sub-arrays 310 and 320 based on a control signal corresponding to a most significant bit (MSB) of the multiplier data B3, B2, B1, and B0. The add-shift operation for each column may improve a latency that occurs in a conventional multiplication operation using a shift-and-add algorithm.

For example, as shown in FIG. 11, the column peripheral circuit 200 may output '1010' that is an add operation value for each column with respect to the first and second sub-arrays 310 and 320 via each of full adder logics 223_1 to 223_8 based on the control signal corresponding to the most significant bit B3 of the multiplier data B3, B2, B1, and B0 transmitted the through shift register circuit 500.

In this case, the column peripheral circuit 200 may perform a left-shift operation that shifts the add operation value for each column to the upper bit side using each of the second multiplexers 224_1 to 224_8.

Then, the column peripheral circuit 200 may store the first temporary data pMult1, which are written back from the shift flip-flops 222_1 to 222_8 via the third multiplexers 225_1 to 225_8, respectively, in the third sub-array 330 as shown in FIG. 12. In this case, the first temporary data pMult1 may be '10100'.

Figure 13:
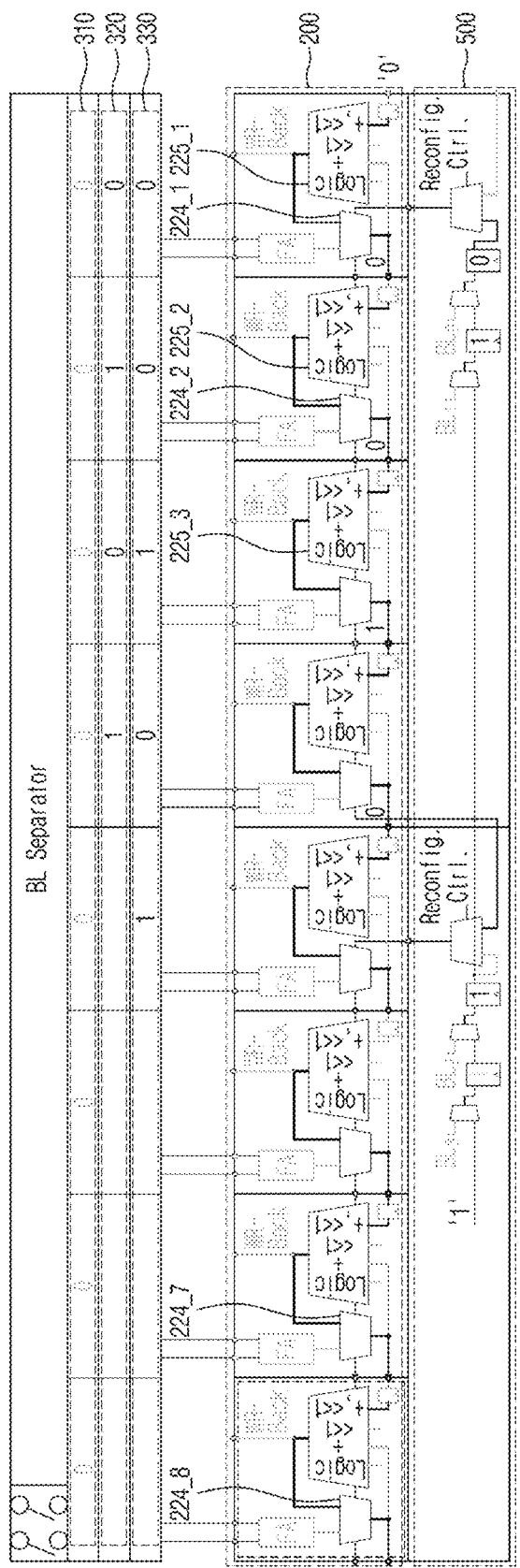
FIGS. 13 and 14 are circuit diagrams showing an operation of an in-memory computing device to obtain second temporary data of FIG. 10.
Figure 14:
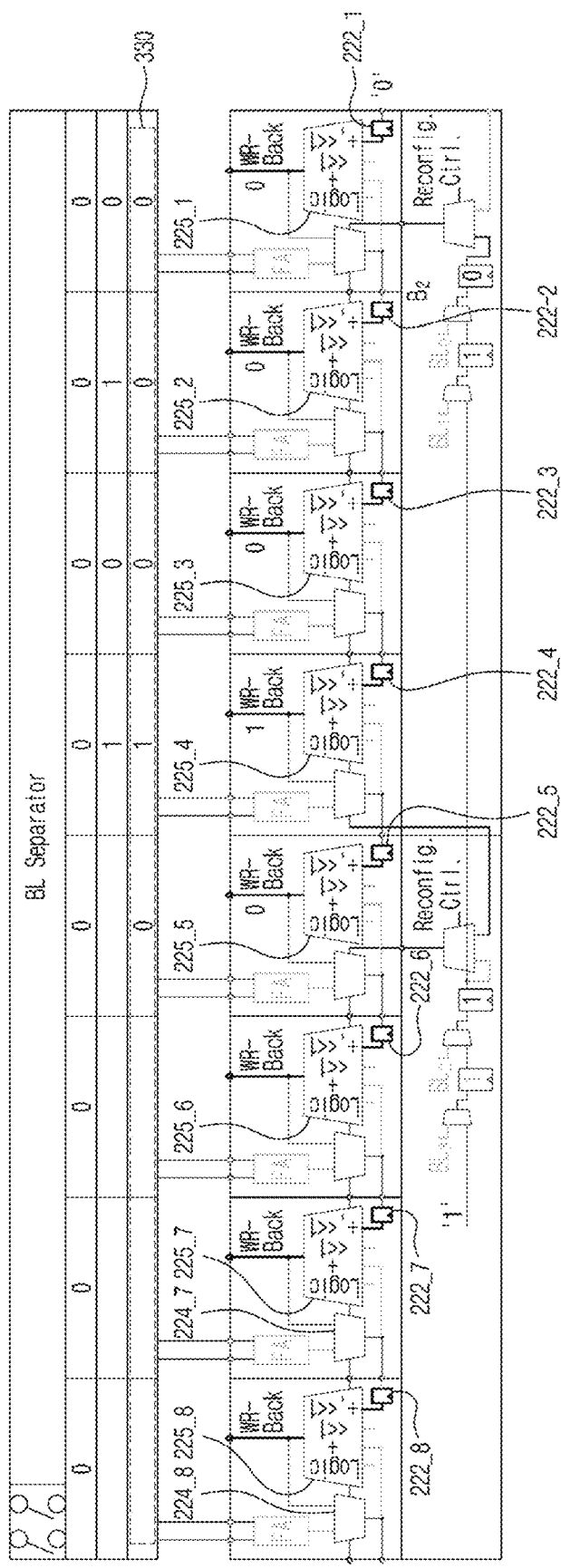

FIGS. 13 and 14 are circuit diagrams showing an operation of the in-memory computing device 11 to obtain the second temporary data pMult2 of FIG. 10.

Referring to FIGS. 13 and 14, the column peripheral circuit 200 may perform the shift operation on the third sub-array 330 based on a control signal in which an intermediate bit B2 or B1 of the multiplier data B3, B2, B1, and B0 corresponds to zero (0).

For example, as shown in FIG. 13, the column peripheral circuit 200 may perform the left-shift operation that shifts the first temporary data pMult1 stored in the shift flip-flop to the upper bit side via each of the second multiplexers 224_1 to 224_8 based on the control signal in which the intermediate bit B2 transmitted through the shift register circuit 500 corresponds to zero (0).

Then, as shown in FIG. 14, the column peripheral circuit 200 may store the second temporary data pMult2, which are written back via the third multiplexers 225_1 to 225_8 from the shift flip-flops 222_1 to 222_8, respectively, in the third sub-array 330. In the present embodiment, the second temporary data pMult2 may be '101000'.

Figure 15:
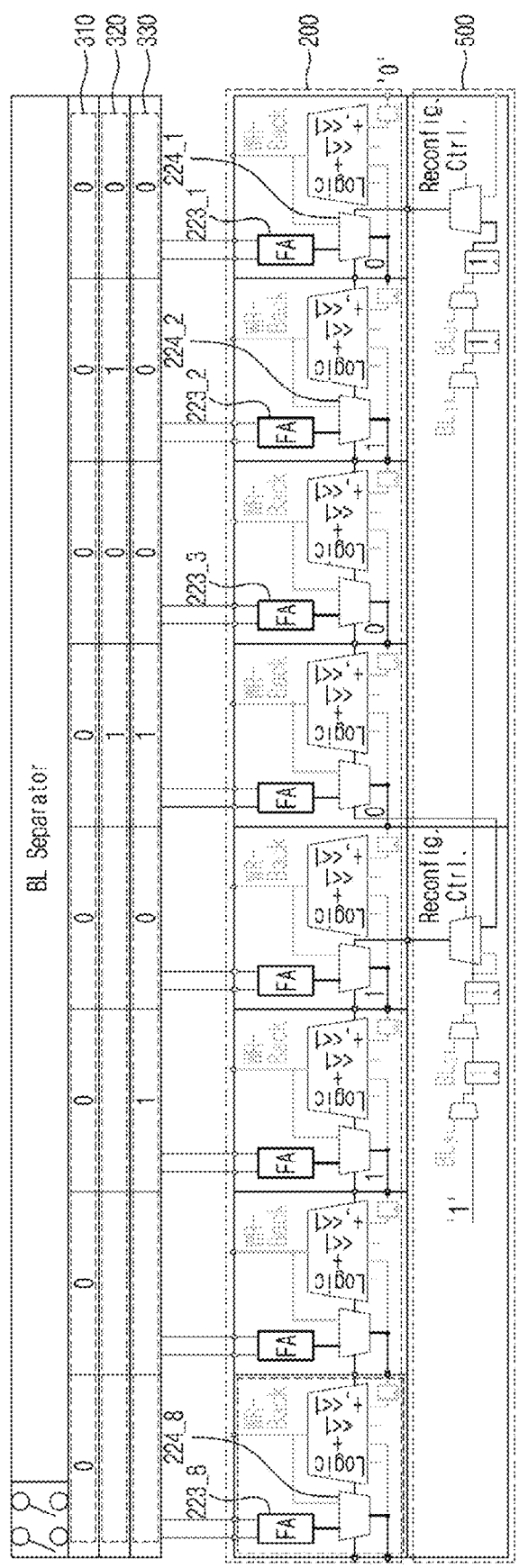
FIGS. 15 and 16 are circuit diagrams showing an operation of an in-memory computing device to obtain third temporary data of FIG. 10.
Figure 16:
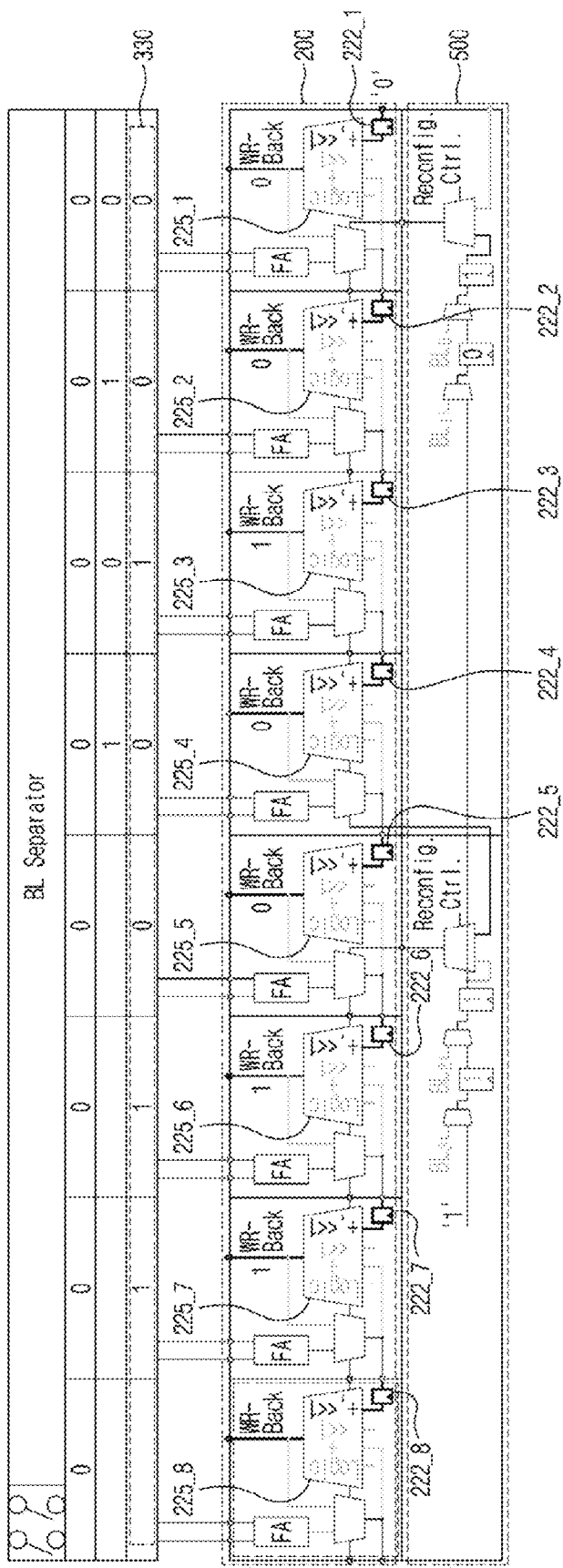

FIGS. 15 and 16 are circuit diagrams showing an operation of the in-memory computing device 11 to obtain the third temporary data tMult of FIG. 10.

Referring to FIGS. 15 and 16, the column peripheral circuit 200 may perform the add-shift operation for each column on the second and third sub-arrays 320 and 330 based on a control signal in which the intermediate bit B2 or B1 of the multiplier data B3, B2, B1, and B0 corresponds to 1.

For example, as shown in FIG. 15, the column peripheral circuit 200 may output '110010' that is the add operation value with respect to the second and third sub-arrays 320 and 330 via the each of the full adder logics 223_1 to 223_8 based on the control signal in which the intermediate bit B1 transmitted through the shift register circuit 500 corresponds to 1.

In this case, the column peripheral circuit 200 may perform the left-shift operation on the add operation value for each column to the upper bit side via each of the second multiplexers 224_1 to 224_8.

Then, as shown in FIG. 16, the column peripheral circuit 200 may store the third temporary data tMult, which are written back from the shift flip-flops 222_1 to 222_8 via the third multiplexers 225_1 to 225_8, in the third sub-array 330. In this case, the third temporary data may be '1100100'.

Figure 17:
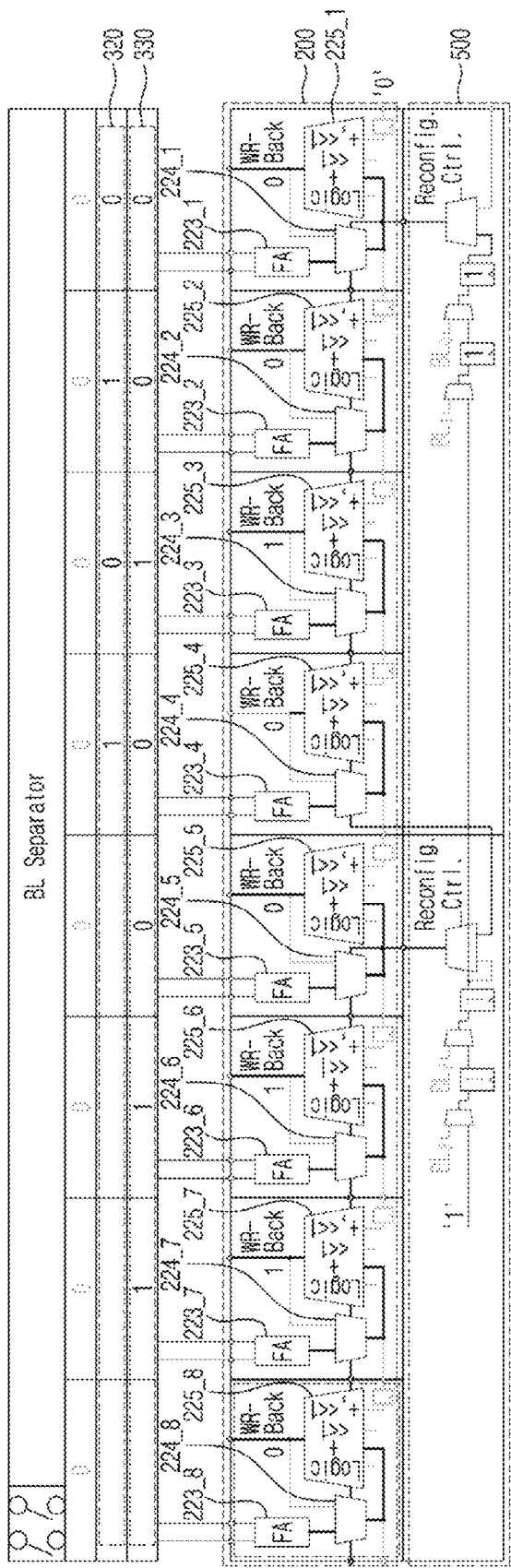
FIG. 17 is a circuit diagram showing an operation of an in-memory computing device to obtain multiplication data of FIG. 10.

FIG. 17 is a circuit diagram showing an operation of the in-memory computing device 11 to obtain the multiplication data MUL_D of FIG. 10.

Referring to FIG. 17, the column peripheral circuit 200 may perform the add operation for each column on the second and third sub-arrays 320 and 330 based on a control signal corresponding to the least significant bit B0 of the multiplier data.

In detail, the column peripheral circuit 200 may perform the add operation for each column on the multiplicand data A3, A2, A1, and A0 stored in the second sub-array 320 and the third temporary data tMult stored in the third sub-array 330.

For example, as shown in FIG. 17, the column peripheral circuit 200 may output '01101110' that is the add operation value for each column with respect to second and third sub-arrays 320 and 330 via each of the full adder logics 223_1 to 223_8 based on the control signal corresponding to the least significant bit provided via the shift register circuit 500.

Then, the column peripheral circuit 200 may store the multiplication data, which are written back from the second multiplexers 224_1 to 224_8 via the third multiplexers 225_1 to 225_8, respectively, in the third sub-array 330. In this case, the multiplication data MUL_D may be '01101110'.

Although the embodiments of the present disclosure have been described with reference to the accompanying drawings, the present disclosure should not be limited to the above-illustrated embodiments, and various kinds of modifications and variations may be added to the embodiments within the same or equal scope of the present disclosure by one skilled in the art. However, even if the working effect of the disclosure is not disclosed in the specification, the effect still can be considered in assessing inventiveness if the effect can be inferred from the descriptions in the specification.

What is claimed is:

1. An in-memory computing device comprising:
   a memory cell array; and
   a column peripheral circuit comprising a plurality of column peripheral units connected to a plurality of pairs of bit lines connected to the memory cell array, each of the column peripheral units comprising:
   a sense amplifying and writing unit sensing and amplifying bitwise data through one pair of bit lines among the pairs of bit lines; and
   an arithmetic logic unit performing an arithmetic operation with a full adder Boolean equation based on the bitwise data and performing a write back operation on operation data obtained by the arithmetic operation via the sense amplifying and writing unit,
   wherein the arithmetic logic unit comprises:
   a first multiplexer receiving a first carry value from a lower bit side; and
   a shift flip-flop receiving a first sum value from the lower bit side.

2. The in-memory computing device of claim 1, wherein the operation data comprise one of logic data comprising NAND, AND, NOR, OR, XNOR, XOR, NOT, and Shift operation values and integer data comprising ADD, ADD-Shift, SUB, and MULT operation values.

3. The in-memory computing device of claim 1, wherein the arithmetic logic unit further comprises:
   a full adder logic calculating a second carry value and a second sum value based on the first carry value, the first sum value, and the bitwise data sensed by the sense amplifying and writing unit;
   a second multiplexer receiving the second sum value and transmitting the second sum value to an upper bit side; and
   a third multiplexer receiving at least one of the first carry value, the first sum value, the second sum value, and the bitwise data.

4. The in-memory computing device of claim 1, wherein the third multiplexer writes back at least one of the first carry value, the first sum value, the second sum value, and the bitwise data via the sense amplifying and writing unit.

5. The in-memory computing device of claim 1, wherein the full adder logic is implemented by a transmission gate-based circuit that is switched in response to a selection signal from the first multiplexer.

6. The in-memory computing device of claim 1, wherein the column peripheral circuit performs a shift operation that transmits the bitwise data to the upper bit side.

7. The in-memory computing device of claim 6, wherein the column peripheral circuit performs all shift operations performed by a plurality of arithmetic logic units at the same time in a single period in which the shift operation is performed.

8. The in-memory computing device of claim 1, wherein the column peripheral circuit performs an add operation that transmits the second carry value to the upper bit side and writes back the second sum value.

9. The in-memory computing device of claim 8, wherein the column peripheral circuit performs all add operations performed by a plurality of arithmetic logic units at the same time in a single period in which the add operation is performed.

10. The in-memory computing device of claim 1, wherein the column peripheral circuit performs an add-shift operation that writes back the first sum value from the lower bit side as the second sum value is transmitted to the upper bit side.

11. The in-memory computing device of claim 10, wherein a period in which the add-shift operation is performed comprises a first period in which the second sum value is transmitted to the upper bit side and a second period in which the first sum value is written back.

12. An in-memory computing device comprising:
a memory cell array;
a column peripheral circuit comprising a plurality of column peripheral units connected to the memory cell array;
a dummy cell array storing multiplicand data stored in the memory cell array;
a BL separator separating the dummy cell array from the memory cell array; and
a shift register circuit controlling a multiplication operation of the column peripheral units based on multiplier data loaded from the memory cell array.

13. The in-memory computing device of claim 12, wherein the dummy cell array comprises:
a first sub-array storing data of zero;
a second sub-array storing the multiplicand data in the order of a least significant bit to a most significant bit; and
a third sub-array storing temporary data that are written back via the column peripheral units.

14. The in-memory computing device of claim 12, wherein the shift register circuit comprises:
a plurality of multiplier flip-flops storing load data that are the multiplier data output in the order of the most significant bit to the least significant bit; and
a plurality of control multiplexers transmitting a control signal to control the column peripheral units based on the load data.

15. The in-memory computing device of claim 13, wherein the column peripheral units perform an add-shift operation for each column on the first and second sub-arrays based on a control signal corresponding to the most significant bit of the multiplier data.

16. The in-memory computing device of claim 13, wherein the column peripheral units perform the shift operation on the third sub-array based on a control signal in which an intermediate bit of the multiplier data corresponds to 0.

17. The in-memory computing device of claim 13, wherein the column peripheral units perform an add-shift operation for each column on the second and third sub-arrays based on a control signal in which an intermediate bit of the multiplier data corresponds to 1.

18. The in-memory computing device of claim 13, wherein the column peripheral units perform an add operation on the second and third sub-arrays based on a control signal corresponding to the least significant bit of the multiplier data.

19. The in-memory computing device of claim 13, wherein each of the column peripheral units comprises:
a first multiplexer receiving a first carry value from a lower bit side;
a shift flip-flop receiving a first sum value from the lower bit side;
a full adder logic calculating a second carry value and a second sum value based on the first carry value, the first sum value, and bitwise data sensed by a sense amplifying and writing unit;
a second multiplexer receiving the second sum value and transmitting the second sum value to an upper bit side; and
a third multiplexer receiving at least one of the first carry value, the first sum value, the second sum value, and the bitwise data.

20. The in-memory computing device of claim 19, wherein the full adder logic is implemented by a transmission gate-based circuit that is switched in response to a selection signal from the first multiplexer.

* * * * *